United States Patent
Ota

(10) Patent No.: US 8,809,878 B2
(45) Date of Patent: Aug. 19, 2014

(54) ILLUMINATION DEVICE

(75) Inventor: Hitoshi Ota, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 471 days.

(21) Appl. No.: 13/240,365

(22) Filed: Sep. 22, 2011

(65) Prior Publication Data

US 2012/0086362 A1    Apr. 12, 2012

(30) Foreign Application Priority Data

Oct. 12, 2010 (JP) ................................. 2010-229326

(51) Int. Cl.
*H01L 27/15* (2006.01)

(52) U.S. Cl.
USPC .................. 257/81; 257/79; 257/99; 257/100; 257/103

(58) Field of Classification Search
USPC .............. 257/89, 81, 79, 80, 82, 99, 100, 103
See application file for complete search history.

(56) References Cited

U.S. PATENT DOCUMENTS

| 6,552,488 B1 * | 4/2003 | Roitman et al. ............... 313/512 |
| 7,553,556 B2 * | 6/2009 | Huo .............................. 428/690 |
| 2010/0194727 A1 | 8/2010 | Seo et al. |

FOREIGN PATENT DOCUMENTS

| JP | A-2004-198503 | 7/2004 |
| JP | A-2007-234447 | 9/2007 |
| JP | A-2008-181008 | 8/2008 |
| WO | WO 2009/075029 A1 | 6/2009 |

* cited by examiner

*Primary Examiner* — Tuyet Thi Vo
(74) *Attorney, Agent, or Firm* — Oliff PLC

(57) ABSTRACT

An organic EL device as an illumination device includes a device substrate as a first substrate having a first surface and a second surface, and a conductor portion provided on the first surface of the device substrate and overlapping the periphery of a luminescent section or at least a part of a region where the luminescent section is provided, when seen in a plan view. The conductor portion includes a conductive material and detects the temperature of the luminescent section.

5 Claims, 6 Drawing Sheets

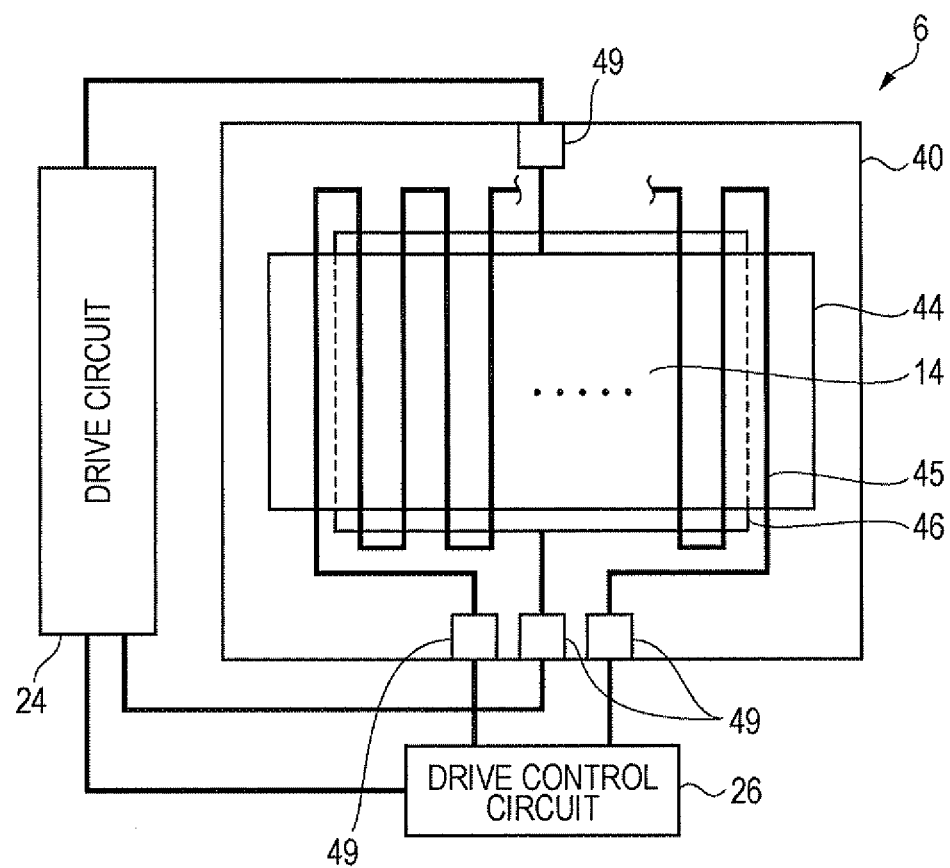

ILLUMINATION DEVICE

BACKGROUND

1. Technical Field

The present invention relates to an illumination device.

2. Related Art

It is known that an organic EL (Electro-Luminescence) material used for light emitting elements of an organic EL panel which is an example of an illumination device has a problem that the luminance of emitted light varies, depending on the ambient temperature, due to temperature characteristics unique to the material. Because of the unique temperature characteristics of the material, particularly, an illumination device suffers a considerable reduction in display quality or "uneven luminance". The "uneven luminance" mentioned herein is originated from a change (deviation) in the I-L characteristics (current-optical output characteristics) that is caused by a temperature difference which may occur in the surface of the substrate (particularly, near the center of the substrate and near the periphery thereof).

JP-A-2007-234447, for example, discloses the technique of detecting the temperatures of a plurality of portions by means of a temperature detector to thereby detect the temperature of the luminescent section so that high-quality image display without uneven luminance is achieved. Further, JP-A-2008-181008, for example, discloses the technique of using a plurality of portions in the luminescent section as light emitting portions and also using the portions as portions whose temperatures are to be detected to thereby accurately detect the drive temperature of the luminance element.

JP-A-2007-234447 discloses the temperature detector provided on an opposing substrate, however, a method of detecting the temperature is not specifically described therein. JP-A-2008-181008 discloses the technique using wires and switches for detecting the temperature, resulting in a higher cost.

SUMMARY

An advantage of some aspects of the invention is to provide a low-cost illumination device which detects the temperature of a light emitting element.

Some aspects of the invention may be achieved as the following embodiments or application examples.

Application Example 1

An illumination device according to the application example 1 of the invention includes a first substrate having a first surface and a second surface, a luminescent section provided on the first surface of the first substrate and having a light emitting element, and a conductor portion overlapping a periphery of the luminescent section or at least a part of a region where the luminescent section is provided, when seen in a plan view. The conductor portion includes a conductive material and detects a temperature of the luminescent section.

When the illumination device according to the application example 1 is in operation, applying a current to the light emitting element causes a luminance layer to emit light. In this case, the luminance of the luminescent section is controlled by the applied current. At the time of such an operation, heat generated when the light emitting element emits light and heat generated by the wiring resistance or the like may vary the temperature of the luminescent section. The light emitting element often has the temperature characteristics such that when the temperature in use varies, the luminance of emitted light in relation to the applied current varies, so that the luminance of the pixel section is likely to vary according to a change in the temperature of the pixel section.

According to the application example 1 of the invention, the conductor portion which detects the temperature of the luminescent section is provided so as to overlap the periphery of the luminescent section or at least a part of the region where the luminescent section is provided, when seen in a plan view. This configuration allows the temperature of the light emitting element to be detected at a low cost without adding a switch for temperature detection.

The word "detection" by the conductor portion is equivalent to direct detection or measurement made by the conductor portion in a narrow sense, and may include the cases of indirectly detecting, calculating, assuming, predicting, forecasting and specifying the temperature based on another parameter or a plurality of other parameters relating to the temperature of the luminescent section in a broad sense.

As described above, the illumination device according to the application example 1 of the invention can detect the temperature of the luminescent section using the conductor portion.

Application Example 2

The illumination device according to the application example 1 may include a plurality of terminal portions provided on the first surface of the first substrate to connect to an external circuit provided in correspondence to the conductor portion.

This configuration can easily establish connection to an external circuit.

Application Example 3

In the illumination device according to the application example 2, the plurality of terminal portions may be disposed close to one another.

Since the terminal portions are located close to one another, it is easy to design an external FPC so that the FPC can be miniaturized.

Application Example 4

The illumination device according to the application example 1 may include a drive control circuit that controls a drive waveform to be applied to the light emitting element so that the light emitting element emits light with a predetermined luminance according to the temperature detected by the conductor portion.

According to this configuration, the luminance of the luminescent section can be controlled to be a desired luminance by applying a current according to the temperature detected by the conductor portion to the light emitting element. That is, a change in luminance of emitted light or a deviation from a desired luminance caused by a change in the temperature of the light emitting element can be reduced or prevented by, for example, detecting the temperature at every predetermined time by means of the conductor portion during the operation of the illumination device, and applying the application current which is corrected to provide the desired luminance based on the detected temperature to the light emitting element.

Application Example 5

In the illumination device according to the application example 1, the conductor portion may have a linear shape repeatedly cranked.

This configuration increases the resistance of the conductor portion, thereby improving the detection sensitivity to a change in temperature.

BRIEF DESCRIPTION OF THE DRAWINGS

The invention will be described with reference to the accompanying drawings, wherein like numbers reference like elements.

FIG. 6 is a block diagram showing the general configuration of an organic EL device according to a third embodiment.

DESCRIPTION OF EXEMPLARY EMBODIMENTS

Exemplary embodiments of the invention will be described below with reference to the accompanying drawings. An organic EL device as an example of the illumination device will be described in the following description of the embodiments by way of example.

First Embodiment

First, the general configuration of an organic EL device according to the first embodiment will be described referring to FIG. 1.

Figure 1:
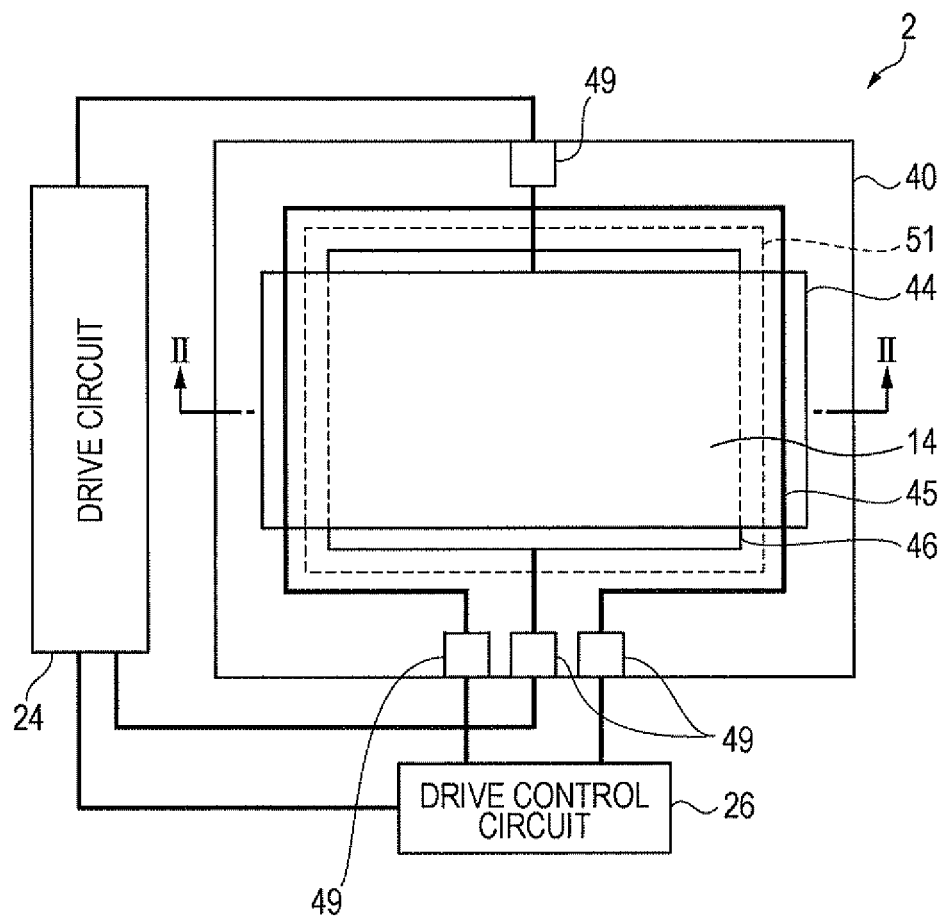
FIG. 1 is a block diagram showing the general configuration of an organic EL device according to a first embodiment.

FIG. 1 is a block diagram showing the general configuration of the organic EL device 2 according to the first embodiment.

The organic EL device 2 includes a device substrate 40 as a first substrate, a luminescent section 14 provided on a first surface of the device substrate 40, and a conductor portion 45 overlapping the periphery of the luminescent section 14 or a part thereof when seen in a plan view.

The organic EL device 2 is connected to a drive circuit 24 and a drive control circuit 26. As will be described later, the drive control circuit 26 generates correction data to be described later based on temperature data relating to the resistance of the conductor portion 45 provided at the periphery of the luminescent section 14, and outputs the correction data to the drive circuit 24.

Figure 2:
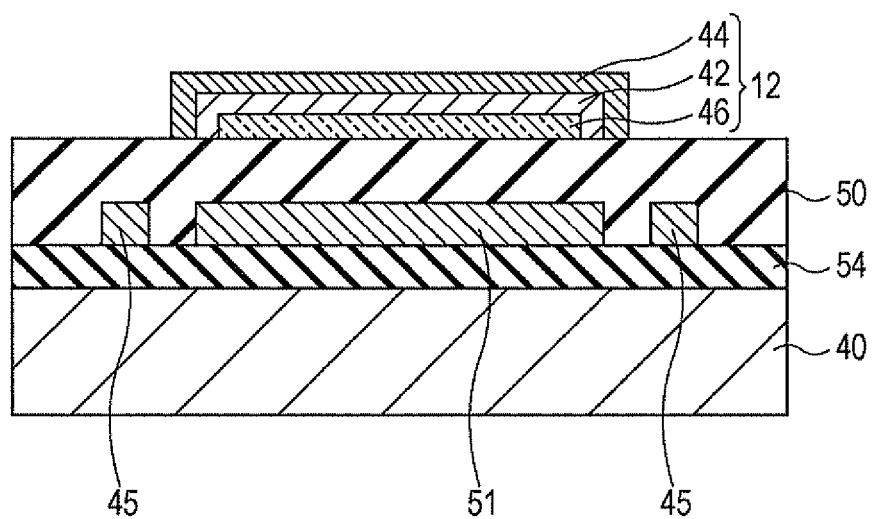
FIG. 2 is a schematic cross-sectional view along line II-II in FIG. 1.

Next, the specific configuration of the organic EL device 2 according to the embodiment will be described referring to FIG. 2. FIG. 2 is a schematic cross-sectional view along line II-II in FIG. 1.

As shown in FIG. 2, the organic EL device 2 includes the device substrate 40, an organic EL element 12 formed above the device substrate 40, and a sealing substrate (not shown). Although the organic EL element 12 is a top-emission type organic EL element which emits light upward in the diagram, it may be a bottom-emission type organic EL element.

The device substrate 40 is formed by, for example, a glass substrate or the like.

The organic EL element 12 includes an organic EL layer 42, a cathode 44 and an anode 46.

The anode 46 is formed above an insulating interlayer 54 and a planarized film 50 which are sequentially formed on the device substrate 40. The anode 46 is, for example, a transparent electrode formed of a transparent material, such as ITO (Indium Tin Oxide), so that light emitted downward in the diagram from the organic EL layer 42 is transmitted downward. The anode 46 is an electrode formed of, for example, ITO as a transparent electrode material to a thickness of 100 nm or so. A reflection film 51 of Mo (Molybdenum) is provided under the anode 46 (on the planarized film 50 side) via an insulating layer. The reflection film 51 reflects light emitted from the organic EL layer 42 toward the sealing substrate. The material for the reflection film 51 is not limited to Mo, and any material may be used as long as the reflection film 51 has a capability (reflection surface) of reflecting emitted light. For example, various approaches are available including a scheme of forming a reflection surface having an uneven surface using an insulating organic material or inorganic material, and a scheme of forming the anode 46 using a conductive material having a reflection capability and forming an ITO film on the surface layer of the anode 46.

The cathode 44 is a common electrode which is shared by organic EL elements 12 formed on the device substrate 40. The cathode 44 is formed on the top surface of the organic EL layer 42.

The sealing substrate in use is made of transparent glass or the like.

The organic EL device 2 has a so-called top-emission type structure where a drive current is supplied between the anode 46 and the cathode 44 so that light emitted from the organic EL layer 42 is reflected at the reflection film 51 and led to the sealing substrate side. The top-emission type structure allows both a transparent substrate and an opaque substrate to be used for the device substrate 40. Examples of opaque substrates include substrates of a heat-curing resin, a thermoplastic resin, etc. in addition to substrates obtained by subjecting a ceramic sheet of alumina or the like or a metal sheet of stainless steel or the like to an insulation process, such as surface oxidization.

According to the embodiment, as shown in FIG. 2, the conductor portion 45 is provided above the device substrate 40. The conductor portion 45 is formed of a conductive material such as Mo so as to detect the temperature near the organic EL element 12 in the luminescent section 14. The conductor portion 45 detects the temperature near the organic EL element 12 based on the change in the resistivity of the conductor portion 45. Terminal portions 49 (see FIG. 1) are provided for the conductor portion 45 to detect a change in resistivity.

Figure 3:
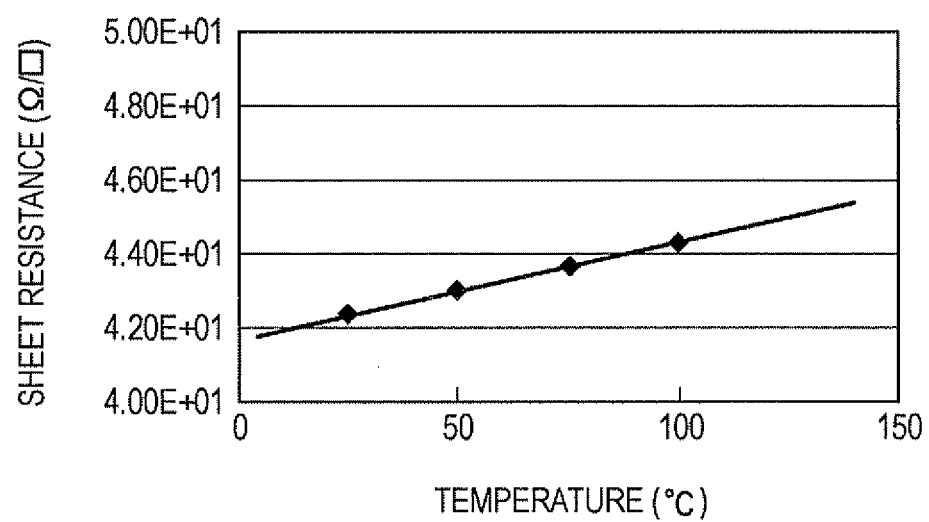
FIG. 3 is a diagram showing the resistivity of Mo in the organic EL device according to the first embodiment.

The temperature dependency of the resistivity of the conductive material of the conductor portion 45 is used in the method of detecting the temperature. The resistivity of Mo as the conductive material is shown in FIG. 3 as an example of the temperature dependency. The temperature is calculated from a change in the resistivity of the conductive material. The thickness of the conductive material Mo is, for example, about 150 nm.

According to the related art, additional use of metal wires for temperature detection increases the cost. According to the embodiment, the conductor portion 45 is formed by the same layer as the reflection film 51, so that the temperature of the organic EL element 12 is detected without adding a new layer. This enables low-cost temperature detection to be achieved.

The conductive material is not limited to Mo, and may be an opaque conductive material such as a metal containing at least one of Au, Ni, Pt, Ag, Al, W, Ta, Ti, Cu, Cr and the like. The conductor portion 45 may include a thin-film thermistor or thermocouple as long as the material is a conductive material, or may include a luminous material, such as an organic or inorganic EL material, or a silicon film doped with a p-type or an n-type impurity. In this case, the temperature can also be detected by using a change in temperature characteristics, such as the resistance of the luminous material or the silicon film.

The sealing substrate prevents moisture from entering the organic EL layer 42 from outside the organic EL device 2. More specifically, the sealing substrate is adhered onto the device substrate 40 by an adhesive to seal the organic EL element 12 so that the air outside the organic EL device 2 does not contact the organic EL element 12. The adhesive to adhere the sealing substrate onto the device substrate 40 includes a heat-curing resin or ultraviolet-curing resin. For example, an epoxy resin, which is one example of the heat-curing resin, is applied to the peripheral portion of the sealing substrate using an applicator unit, such as a dispenser.

Figure 4:
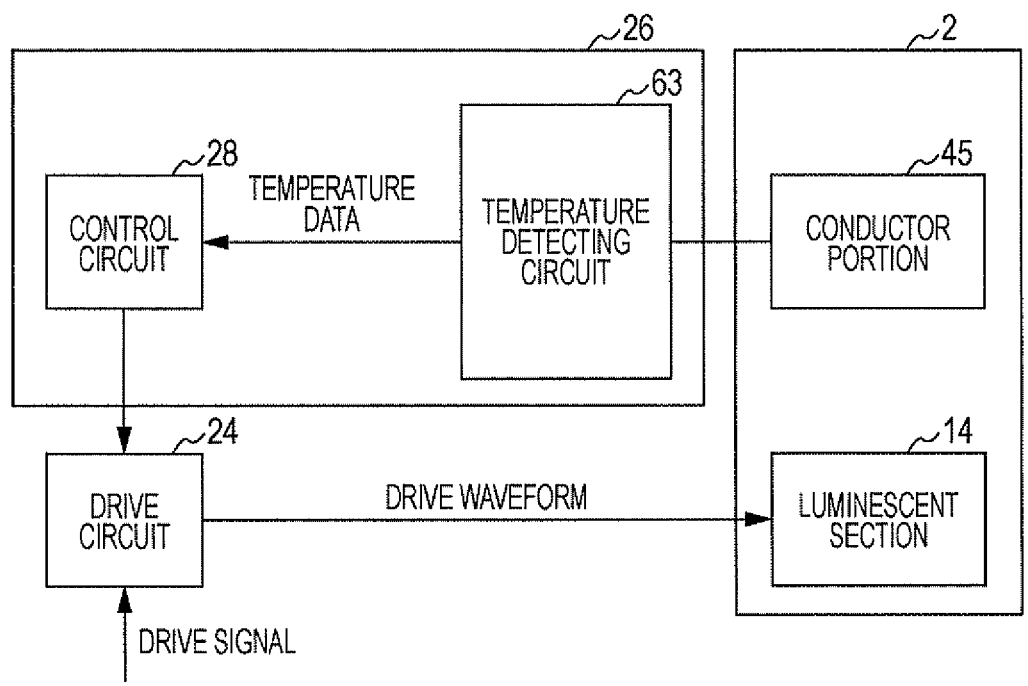
FIG. 4 is a block diagram showing a method of driving the organic EL device according to the first embodiment.

Next, a method of driving the organic EL device 2 according to the first embodiment will be described referring to FIG. 4. FIG. 4 is a block diagram showing a method of driving the organic EL device 2 according to the embodiment.

The organic EL device 2 includes the conductor portion 45 and the luminescent section 14, and the drive control circuit 26 includes a temperature detecting circuit 63 and a control circuit 28. The organic EL device 2, the drive control circuit 26 and the drive circuit 24 are configured to exchange data with one another.

When the organic EL device 2 is in operation, as shown in FIG. 4, the temperature detecting circuit 63 of the drive control circuit 26 detects the resistance of the conductor portion 45 at, for example, every predetermined time, and outputs temperature data relating to the detected resistance to the control circuit 28.

The control circuit 28 generates correction data relating to a drive waveform to acquire a desired luminance based on the temperature data from the temperature detecting circuit 63, and outputs the correction data to the drive circuit 24.

The "correction data" herein is data for changing parameters, such as the width, height and shape of the drive waveform or the shape of inrush current, in such a way that the difference between the drive waveform which is determined according to a preset temperature and the drive waveform which is determined according to the detected temperature becomes smaller.

That is, the correction data is data for reducing (i.e., correcting) the difference between the application current needed to cause the organic EL layer 42 to emit light with a desired luminance at the preset temperature and the application current needed to cause the organic EL layer 42 to emit light with a desired luminance at the detected temperature.

The drive circuit 24 generates the drive waveform for driving the luminescent section 14 from the correction data and display data from the control circuit 28, and supplies the generated drive waveform to the luminescent section 14. As a result, the application current with the drive waveform according to the detected temperature is applied to the organic EL element 12. In other words, the temperature detected by the temperature detecting circuit 63 is fed back to the control circuit 28, so that the application current with the drive waveform adjusted according to the temperature of the luminescent section 14 (or the organic EL element 12) is applied to the organic EL element 12.

Accordingly, even when the temperature of the luminescent section 14 changes due to the heat generated when the organic EL element 12 emits light or a change in the ambient temperature, the luminance of the luminescent section 14 can be controlled to be the desired luminance.

According to the embodiment, as described above, the provision of the conductor portion 45 allows the temperature detecting circuit 63 to detect the temperature at every predetermined time while the organic EL device 2 is in operation. The application current with the drive waveform corrected, on the basis of the detected temperature, to provide the desired luminance is applied to the organic EL element 12, thereby suppressing or preferably preventing a change in the luminance of emitted light or a deviation of the luminance of emitted light from the desired luminance due to a change in the temperature of the organic EL element 12.

Further, referring to FIG. 2, according to the embodiment, the reflection film 51 which is the reflection portion provided on the device substrate 40 can be shared as the conductor portion 45. That is, the conductor portion 45 can be formed at a low cost.

As described above, the organic EL device 2 according to the embodiment includes the conductive portion 45 that is used to detect the temperature of the luminescent section 14 and the drive control circuit 26 that corrects the drive waveform on the basis of the detected temperature, thereby enabling high-quality light emission to be achieved. Moreover, the reflection film 51 provided above the device substrate 40 is also used as the conductive portion 45, thereby enabling the conductive portion 45 to be formed at a low cost.

Second Embodiment

Next, an organic EL device according to a second embodiment will be described referring to FIG. 5.

Figure 5:
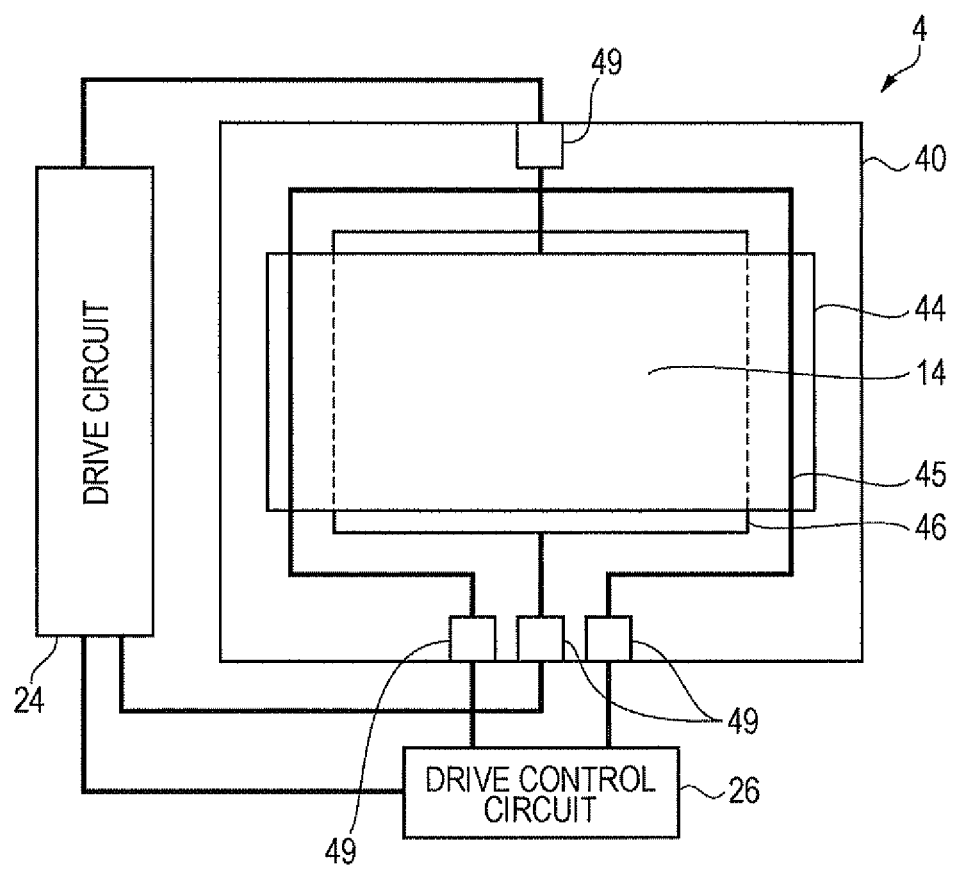
FIG. 5 is a block diagram showing the general configuration of an organic EL device according to a second embodiment.

FIG. 5 is a block diagram similar to FIG. 1 for the first embodiment. To avoid the redundant description, same reference numerals as used for the components of the first embodiment shown in FIG. 1 are given to those components in FIG. 5 which are similar to the corresponding components of the first embodiment.

In an organic EL device 4 according to the second embodiment, the conductor portion 45 includes a conductive film of the same layer as the anode 46. This embodiment also allows the temperature of the luminescent section 14 to be detected by measuring the resistance of the conductor portion 45 similarly to the first embodiment. Since the conductor portion 45 is the same layer as the anode 46, it is unnecessary to add a new conductive layer, leading to cost reduction.

Third Embodiment

Next, an organic EL device according to a third embodiment will be described referring to FIG. 6.

FIG. 6 is a block diagram similar to FIG. 1 for the first embodiment. To avoid the redundant description, same reference numerals as used for the components of the first embodiment shown in FIG. 1 are given to those components in FIG. 6 which are similar to the corresponding components of the first embodiment.

In an organic EL device 6 according to the embodiment, the conductor portion 45 is formed into a single linear shape repeatedly cranked to detect the temperature of the luminescent section 14.

For example, as shown in FIG. 6, the conductor portion 45 is formed into a single linear shape repeatedly cranked, extending in an up-and-down direction in the diagram of the luminescent section 14. Therefore, the resistance of the conductor portion 45 increases, so that the detection sensitivity to a change in temperature can be improved.

Accordingly, the drive control circuit 26 corrects the drive waveform to be applied to the luminescent section 14 according to a change in temperature based on the improved detection sensitivity, and therefore a variation in the luminance of the luminescent section 14 can be reduced or prevented.

Particularly, when the luminescent section 14 is wide (i.e., the device substrate 40 or the illumination device has a large size), the temperature distribution of the luminescent section 14 is likely to occur, which causes variations in the luminance of the luminescent section 14. Therefore, it is effective to correct the drive waveform according to the temperatures of a plurality of luminescent sections 14 which are detected by increasing the resistance of the conductor portion 45.

The organic EL devices 2, 4 and 6 according to the embodiments each include a plurality of terminal portions 49 disposed near one another as shown in FIGS. 1, 5 and 6, respectively. Since the terminal portions 49 are located close to one another according to the embodiments, it is easy to design an external FPC (not shown) so that the FPC is miniaturized.

This application claims priority from Japanese Patent Application No. 2010-229326 filed in the Japanese Patent Office on Oct. 12, 2010, the entire disclosure of which is hereby incorporated by reference in its entirely.

What is claimed is:

1. An illumination device comprising:
 a first substrate having a first surface and a second surface;
 a luminescent section provided on the first surface of the first substrate and having a light emitting element; and
 a conductor portion overlapping a periphery of the luminescent section or at least a part of a region where the luminescent section is provided, when seen in a plan view,
 the conductor portion including a conductive material and detecting a temperature of the luminescent section.

2. The illumination device according to claim 1, further comprising a drive control circuit that controls a drive waveform to be applied to the light emitting element so that the light emitting element emits light with a predetermined luminance according to the temperature detected by the conductor portion.

3. The illumination device according to claim 1, wherein the conductor portion has a linear shape repeatedly cranked.

4. The illumination device according to claim 1, further comprising a plurality of terminal portions provided on the first surface of the first substrate to connect to an external circuit provided in correspondence to the conductor portion.

5. The illumination device according to claim 4, wherein the plurality of terminal portions are disposed close to one another.

* * * * *